United States Patent
Kim et al.

(10) Patent No.: US 11,646,393 B2
(45) Date of Patent: May 9, 2023

(54) OPTO-ELECTRONIC DEVICE AND IMAGE SENSOR INCLUDING THE SAME

(71) Applicant: SAMSUNG ELECTRONICS CO., LTD., Suwon-si (KR)

(72) Inventors: Hojung Kim, Suwon-si (KR); Chanwook Baik, Yongin-si (KR); Kyungsang Cho, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 290 days.

(21) Appl. No.: 17/036,962

(22) Filed: Sep. 29, 2020

(65) Prior Publication Data

US 2021/0376190 A1     Dec. 2, 2021

(30) Foreign Application Priority Data

Jun. 1, 2020   (KR) .................. 10-2020-0066017

(51) Int. Cl.
| | |
|---|---|
| *H01L 33/06* | (2010.01) |
| *H01L 33/38* | (2010.01) |
| *H01L 33/42* | (2010.01) |
| *H01L 33/62* | (2010.01) |

(52) U.S. Cl.
CPC ............ *H01L 33/06* (2013.01); *H01L 33/387* (2013.01); *H01L 33/42* (2013.01); *H01L 33/62* (2013.01)

(58) Field of Classification Search
CPC ....... H01L 33/06; H01L 33/387; H01L 33/42; H01L 33/62
See application file for complete search history.

(56) References Cited

U.S. PATENT DOCUMENTS

| | | | |
|---|---|---|---|
| 9,030,189 B2 | 5/2015 | Sargent | |
| 9,786,857 B2 | 10/2017 | Huang et al. | |
| 9,812,596 B2 | 11/2017 | Cho et al. | |
| 10,529,879 B2 | 1/2020 | Cho et al. | |
| 11,177,411 B2 * | 11/2021 | Kallioinen | ...... H01L 31/035218 |
| 2013/0032782 A1 * | 2/2013 | Gerasimos | ............. B82Y 20/00 257/21 |
| 2014/0291608 A1 * | 10/2014 | Sargent | ........... H01L 31/022466 257/9 |
| 2018/0175241 A1 * | 6/2018 | Jain | .................... H01L 29/40114 |
| 2019/0189815 A1 * | 6/2019 | Cho | .................... H01L 31/0336 |

FOREIGN PATENT DOCUMENTS

| | | |
|---|---|---|
| KR | 10-0884887 B1 | 2/2009 |
| KR | 10-2017-0033734 A | 3/2017 |
| KR | 10-2019-0072967 A | 6/2019 |

* cited by examiner

*Primary Examiner* — Mark W Tornow
(74) *Attorney, Agent, or Firm* — Sughrue Mion, PLLC

(57) ABSTRACT

Provided is an opto-electronic device including a semiconductor substrate doped with a first conductivity type impurity, a source region and a drain region provided on the semiconductor substrate spaced apart from each other and doped with a second conductivity type impurity which is electrically opposite to the first conductivity type impurity, a first electrode and a second electrode electrically connected to the source region and the drain region, respectively, a quantum dot layer provided between the source region and the drain region on the semiconductor substrate and including quantum dots, a first insulation layer configured to insulate the semiconductor substrate and the quantum dot layer from each other, and a transparent electrode layer provided on the quantum dot layer.

20 Claims, 4 Drawing Sheets

OPTO-ELECTRONIC DEVICE AND IMAGE SENSOR INCLUDING THE SAME

CROSS-REFERENCE TO RELATED APPLICATION

This application claims priority to Korean Patent Application No. 10-2020-0066017, filed on Jun. 1, 2020, in the Korean Intellectual Property Office, the disclosure of which is incorporated herein in its entirety by reference.

BACKGROUND

1. Field

Example embodiments of the present disclosure relate to an opto-electronic device and an image sensor including the same.

2. Description of Related Art

An image sensor includes an array of opto-electronic devices for converting a light signal into an electrical signal. A pixel is implemented by each of the opto-electronic devices. As the resolution of the image sensor increases, the size of a unit pixel in the image sensor is gradually reduced. If the pixel size is reduced, a light receiving area of a light sensing opto-electronic device is reduced, and thus, the number of photons entering the pixel per unit time is reduced. Accordingly, with regard to signals output from a light receiving element of the pixel, the proportion of dark noise is increased and a signal-to-noise ratio is lowered, making it difficult to obtain a clear image.

In addition, with the market expansion for smartphones, autonomous driving vehicles, robots, or security systems, there is a demand for an opto-electronic device which is stably operable in a low-light environment, is feasible for miniaturization, and has low manufacturing costs, and an image sensor employing the opto-electronic device.

SUMMARY

One or more example embodiments provide an opto-electronic device having high sensitivity and an enhanced signal-to-noise ratio.

One or more example embodiments also provide an opto-electronic device feasible for miniaturization and having low manufacturing costs.

One or more example embodiments also provide an image sensor comprising the opto-electronic device.

Additional aspects will be set forth in part in the description which follows and, in part, will be apparent from the description, or may be learned by practice of example embodiments of the disclosure.

According to an aspect of an example embodiment, there is provided an opto-electronic device including a semiconductor substrate doped with a first conductivity type impurity, a source region and a drain region provided on the semiconductor substrate spaced apart from each other and doped with a second conductivity type impurity which is electrically opposite to the first conductivity type impurity, a first electrode and a second electrode electrically connected to the source region and the drain region, respectively, a quantum dot layer provided between the source region and the drain region on the semiconductor substrate and including quantum dots, a first insulation layer configured to insulate the semiconductor substrate and the quantum dot layer from each other, and a transparent electrode layer provided on the quantum dot layer.

The opto-electronic device may further include a second insulation layer configured to insulate the transparent electrode layer and the quantum dot layer from each other.

The first insulation layer and the second insulation layer may form an insulating material layer surrounding the quantum dot layer.

The quantum dot layer may include a transparent layer, and the quantum dots may be dispersed in the transparent layer.

The transparent layer may include a transparent oxide semiconductor material.

The transparent oxide semiconductor material may include at least one of silicon indium zinc oxide (SIZO), silicon zinc tin oxide (SZTO), indium gallium zinc oxide (IGZO), indium zinc oxide (IZO), and zinc tin oxide (ZTO).

The opto-electronic device may further include a conductive layer provided between the quantum dot layer and the first insulation layer.

The quantum dot layer may further include a first layer provided on the first insulation layer, the quantum dots provided on the first layer, and a second layer covering the quantum dots.

The first layer and the second layer may each include an oxide semiconductor material.

The second layer may be transparent.

The oxide semiconductor material may include at least one of silicon indium zinc oxide (SIZO), silicon zinc tin oxide (SZTO), indium gallium zinc oxide (IGZO), indium zinc oxide (IZO), and zinc tin oxide (ZTO).

The opto-electronic device may further include a conductive layer provided between the quantum dot layer and the first insulation layer.

The opto-electronic device may further include a conductive layer provided between the quantum dot layer and the first insulation layer.

The quantum dot layer may include a transparent oxide semiconductor layer and the quantum dots dispersed in the transparent oxide semiconductor layer.

The quantum dot layer may further include a first layer disposed on the first insulation layer, the quantum dots being disposed on the first layer, and a second layer covering the quantum dots, wherein the first layer and the second layer include an oxide semiconductor material, and wherein the second layer is transparent.

According to another aspect of an example embodiment, there is provided an opto-electronic device including a semiconductor substrate doped with a first conductivity type impurity, a source region and a drain region provided on the semiconductor substrate spaced apart from each other and doped with a second conductivity type impurity which is electrically opposite to the first conductivity type impurity, a first electrode and a second electrode electrically connected to the source region and the drain region, respectively, a transparent electrode layer provided between the source region and the drain region on the semiconductor substrate, and a quantum dot layer including quantum dots, the quantum dot layer being provided between the transparent electrode layer and the semiconductor substrate on the semiconductor substrate, and surrounded by an insulating material layer.

The quantum dot layer may include a transparent oxide semiconductor layer, and the quantum dots are surrounded by the transparent oxide semiconductor layer.

The quantum dot layer may further include a first oxide semiconductor layer, the quantum dots being disposed on the first oxide semiconductor layer, and a second oxide semiconductor layer covering the quantum dots.

The opto-electronic device may further include a conductive layer in contact with the quantum dot layer and provided between the quantum dot layer and the insulating material layer.

According to an aspect of an example embodiment, there is provided an image sensor including an array of a plurality of opto-electronic devices, and a driving circuit configured to output a signal from each of the opto-electronic devices, wherein each of the opto-electronic devices includes a semiconductor substrate doped with a first conductivity type impurity, a source region and a drain region provided on the semiconductor substrate spaced apart from each other and doped with a second conductivity type impurity which is electrically opposite to the first conductivity type impurity, a first electrode and a second electrode electrically connected to the source region and the drain region, respectively, a transparent electrode layer provided between the source region and the drain region on the semiconductor substrate, and a quantum dot layer including quantum dots, the quantum dot layer being provided between the transparent electrode layer and the semiconductor substrate on the semiconductor substrate, and surrounded by an insulating material layer.

BRIEF DESCRIPTION OF THE DRAWINGS

The above and/or other aspects, features, and advantages of example embodiments will be more apparent from the following description taken in conjunction with the accompanying drawings, in which.

DETAILED DESCRIPTION

Figure 1:
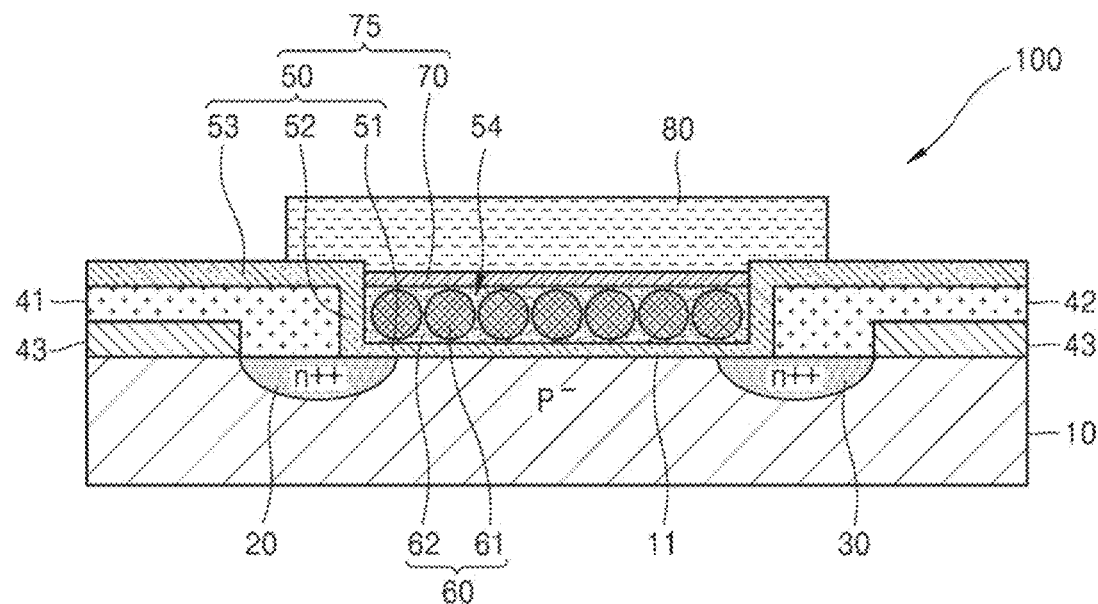
FIG. 1 is a cross-sectional view schematically showing a structure of an opto-electronic device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, an opto-electronic device having a metal oxide semiconductor field effect transistor (MOSFET) structure and an image sensor comprising the same will be described in further detail. In the drawings, the same reference numerals refer to the elements, and the sizes of various components are exaggerated or reduced for clarity and brevity. Meanwhile, the following example embodiment are presented by way of example only, and various changes and modifications may be made from the description of these example embodiments.

In the following description, when an element is referred to as being "above" or "on" another element, it can be directly on the other element in a contact manner or in a non-contact manner. An expression used in the singular encompasses the expression of the plural, unless it has a clearly different meaning in the context. In addition, it will be understood that the term "comprising or including" specifies the addition and/or presence of one or more other components, but does not preclude the possibility of excluding the stated components features, unless the context clearly indicates otherwise.

The term "the" and demonstrative terms similar thereto may be used while corresponding to both singular and plural forms. If there is neither clear description nor contrary description of the sequence of operations of a method according to an example embodiment, the operations may be performed in an appropriate sequence. However, embodiments are not limited to the sequence of describing the operations.

In addition, the term '~unit' or 'module' used herein refers to a unit of processing one or more functions or operations, which may be implemented in software or hardware or in a combination of software and hardware.

Connection of lines between elements or connecting elements shown in the drawings are just examples for functional connections and/or physical or circuit connections, which may be replaceable or may be embodied as various additional functional connections, physical connections, or circuit connections in real devices.

All examples or exemplary terms are used merely to describe the example embodiments in further detail and do not limit the scope unless otherwise defined by the claims.

FIG. 1 is a cross-sectional view schematically showing a structure of an opto-electronic device 100 according to an example embodiment. Referring to FIG. 1, the opto-electronic device 100 according to an example embodiment may include a semiconductor substrate 10, a source region 20 and a drain region 30 provided on the semiconductor substrate 10 to be spaced apart from each other, a first electrode 41 and a second electrode 42 electrically connected to the source region 20 and the drain region 30, respectively, a quantum dot layer 60 provided on a region between the source region 20 and the drain region 30 of the semiconductor substrate 10, and a transparent electrode layer 80 provided on the quantum dot layer 60.

At least a portion of the semiconductor substrate 10 may be doped with a first conductivity type impurity. For example, the least a portion of the semiconductor substrate 10 may include a semiconductor material of the first conductivity type. For example, the semiconductor substrate 10 may be made of silicon (Si), germanium (Ge), or a compound semiconductor material and may be wholly or partially doped with the first conductivity type impurity.

The source region 20 and the drain region 30 may be provided to be adjacent to a surface 11 of the semiconductor substrate 10. The source region 20 and the drain region 30 are regions corresponding to portions of the semiconductor substrate 10 doped with a second conductivity type impurity which is electrically opposite to the first conductivity type impurity. The source region 20 and the drain region 30 are provided to be spaced apart from each other with the region of the semiconductor substrate 10 doped with the first conductivity impurity therebetween. The region located between the source region 20 and the drain region 30 and doped with the first conductivity type impurity may function as a channel region. The region of the semiconductor substrate 10 doped with the first conductivity type impurity may be doped in a lower concentration than the source region 20 and the drain region 30 doped with the second conductivity type impurity. In an example embodiment, as illustrated in FIG. 1, the semiconductor substrate 10 may be doped with a p type, and the source region 20 and the drain region 30 may be doped with an n type. However, embodiments are not limited thereto. For example, in another example embodiment, the semiconductor substrate 10 may be doped with an n type, and the source region 20 and the drain region 30 may be doped with a p type.

The first electrode 41 is electrically connected to the source region 20. The second electrode 42 is electrically connected to the drain region 30. The first electrode 41 and the second electrode 42 are electrically insulated from the semiconductor substrate 10 by an insulation layer 43.

The quantum dot layer 60 is provided on a region between the source region 20 and the drain region 30 of the semiconductor substrate 10. The quantum dot layer 60 is provided between the semiconductor substrate 10 and the transparent electrode layer 80. External light may enter the quantum dot layer 60 through the transparent electrode layer 80. Therefore, the transparent electrode layer 80 may be made of a transparent conductive material, for example, indium tin oxide (ITO).

The quantum dot layer 60 is insulated from at least the semiconductor substrate 10. In the opto-electronic device 100 according to the example embodiment, the quantum dot layer 60 is electrically insulated from the semiconductor substrate 10 and the transparent electrode layer 80. In an example embodiment, the first insulation layer 50 is interposed between the quantum dot layer 60 and the semiconductor substrate 10 and insulates the quantum dot layer 60 and the semiconductor substrate 10 from each other. The second insulation layer 70 is interposed between the quantum dot layer 60 and the transparent electrode layer 80 and insulates the quantum dot layer 60 and the transparent electrode layer 80 from each other.

The first insulation layer 50 may electrically insulate the quantum dot layer 60 from the first electrode 41 and the second electrode 42. In an example embodiment, the first insulation layer 50 may include a first portion 51 provided between the semiconductor substrate 10 and the quantum dot layer 60, and a second portion 52 upwardly extending from the first portion 51 along regions between each of the first electrode 41 and the quantum dot layer 60 and the second electrode 42 and the quantum dot layer 60, and insulating the quantum dot layer 60 from the first electrode 41 and the second electrode 42. A recessed concave portion 54 may be formed by the first insulation layer 50. The first portion 51 and the second portion 52 form a bottom wall and side walls of the concave portion 54, respectively. The quantum dot layer 60 may be provided within the concave portion 54. The second insulation layer 70 covers the quantum dot layer 60. The concave portion 54 is closed by the second insulation layer 70. An insulating material layer 75 surrounding the quantum dot layer 60 is formed by the first insulation layer 50 and the second insulation layer 70.

The transparent electrode layer 80 is provided on the second insulation layer 70. The transparent electrode layer 80 is insulated from the quantum dot layer 60 by the second insulation layer 70. The first insulation layer 50 may electrically insulate the transparent electrode layer 80 from the first electrode 41 and the second electrode 42. For example, the first insulation layer 50 may include a third portion 53 extending from the second portion 52 along top surfaces of the first electrode 41 and the second electrode 42. The transparent electrode layer 80 may be formed on a surface of the third portion 53.

The first electrode 41, the second electrode 42, and the transparent electrode layer 80 may function as a source electrode, a drain electrode, and a gate electrode (control electrode), respectively. The opto-electronic device 100 may be a complementary metal oxide semiconductor (CMOS) type field effect transistor (FET). In the FET, if a gate voltage greater than or equal to a threshold voltage is applied to the transparent electrode layer 80 in a state in which a voltage is applied to the first electrode 41 and the second electrode 42, a current flows from the source region 20 to the drain region 30. The quantum dot layer 60 interposed between the first insulation layer 50 and the second insulation layer 70 changes the threshold voltage of the FET according to the intensity of incident light. A change in the threshold voltage varies the current flowing from the source region 20 to the drain region 30. The light intensity may be obtained by measuring a change in the current flowing from the source region 20 to the drain region 30. Therefore, the FET shown in FIG. 1 may function as the opto-electronic device 100.

The light enters the quantum dot layer 60 through the transparent electrode layer 80. In an example embodiment, the quantum dot layer 60 may include a transparent layer 62 and quantum dots 61 dispersed in the transparent layer 62. Although FIG. 1 shows the quantum dots 61 forming a single layer, the quantum dots 61 may form a plurality of layers. The quantum dots 61 may be regularly or irregularly dispersed in the transparent layer 62. The quantum dots 61 are particles having a predetermined size, which exert a quantum confinement effect. The quantum dots 61 may include, for example, a compound, such as cadmium selenide (CdSe), cadmium telluride (CdTe), indium phosphide (InP), indium arsenide (InAs), indium antimonide (InSb), lead selenide (PbSe), lead sulfide (PbS), lead telluride (PbTe), aluminum arsenide (AlAs), zinc sulfide (ZnS), zinc selenide (ZnSe), or zinc telluride (ZnTe). A wavelength of light absorbed by the quantum dots 61 may vary according to the bandgap of the quantum dots 61. The bandgap of the quantum dots 61 may be typically determined by diameters of the quantum dots 61. For example, the quantum dots 61 may have diameters ranging from about 1 nm to about 10 nm. Therefore, the diameters of the quantum dots 61 may vary according to the wavelength of light to be detected by the opto-electronic device 100. The quantum dots 61 may have various diameters by constructing the opto-electronic device 100 so as to sense the light of a wide wavelength band. In addition, if the opto-electronic device 100 is constructed to detect the light of a particular wavelength band, the quantum dots 61 may have the same diameter.

If light enters the quantum dots 61, the quantum dots 61 absorbs the light to generate photocarriers, that is, pairs of movable electrons and holes. The photocarriers generated in the quantum dots 61 are confined by the first insulation layer 50 and the second insulation layer 70, so that they do not move to the semiconductor substrate 10 and the transparent electrode layer 80. For example, movement of the electrons and the holes in a direction from the quantum dot layer 60 to the transparent electrode layer 80 and the semiconductor substrate 10 or in an opposite direction does not occur. The electrons and the holes are separated from each other in the quantum dot layer 60 with the quantum dots 61 disposed therebetween.

The transparent layer 62 may be made of a light transmissible material with respect to the wavelength band of the light to be detected by the opto-electronic device 100 to transfer the light passing through the transparent electrode layer 80 to the quantum dots 61. The transparent layer 62 may be an oxide semiconductor layer including a transparent oxide semiconductor material. The transparent oxide semiconductor material may include, for example, silicon indium zinc oxide (SIZO), silicon zinc tin oxide (SZTO), indium gallium zinc oxide (IGZO), indium zinc oxide (IZO), or zinc tin oxide (ZTO). A zinc-based oxide, such as SIZO, SZTO, IGZO, IZO, or ZTO, is a transparent oxide semiconductor material having a generally n-type electrical property. A material, such as copper aluminum oxide ($CuAlO_2$), $CuG_2O_2$, strontium cuprate ($SrCu_2O_2$), or tin oxide ($SnO_2$), is a transparent oxide semiconductor material having a p-type electrical property. When necessary, a transparent oxide semiconductor material having appropriate electrical characteristics may be selected as the material of the transparent layer 62.

The transparent layer 62 may be formed to have a relatively small thickness. For example, the transparent layer 62 may have a thickness ranging from about 1 nm to about 100 nm. Since the quantum dot layer 60 including the transparent layer 62 and the quantum dots 61 is formed to have a relatively small thickness, the opto-electronic device 100 may be formed to be sufficiently thin.

The transparent layer 62 may separate electrons and holes generated at the quantum dots 61 from each other. To separate electrons and holes, the transparent layer 62 comes into contact with the quantum dots 61. According to the example embodiment, a quantum dot layer 60 having the quantum dots 61 dispersed in the transparent layer 62 is employed. Therefore, interfacial areas between the transparent layer 62 and the quantum dots 61 may increase, and thus the electron-hole separating efficiency may be improved.

The transparent layer 62 may function as a reset electrode. For example, after the quantum dot layer 60 is refreshed by applying a reset voltage to the transparent layer 62, a voltage applied to the transparent layer 62 may be cut off. In such a state, if light enters the quantum dot layer 60, photocarriers are generated to change a threshold voltage of the FET opto-electronic device 100, and the current flowing from the source region 20 to the drain region 30 may vary. The intensity of light may be detected by measuring a change in the current.

The transparent electrode layer 80 may function as a reset electrode. The quantum dot layer 60 may be refreshed by applying a high voltage to the transparent electrode layer 80. Then, if light enters the quantum dot layer 60, photocarriers are generated to change a threshold voltage of the FET opto-electronic device 100, and the current flowing from the source region 20 to the drain region 30 may vary. The intensity of light may be detected by measuring a change in the current.

Figure 2:
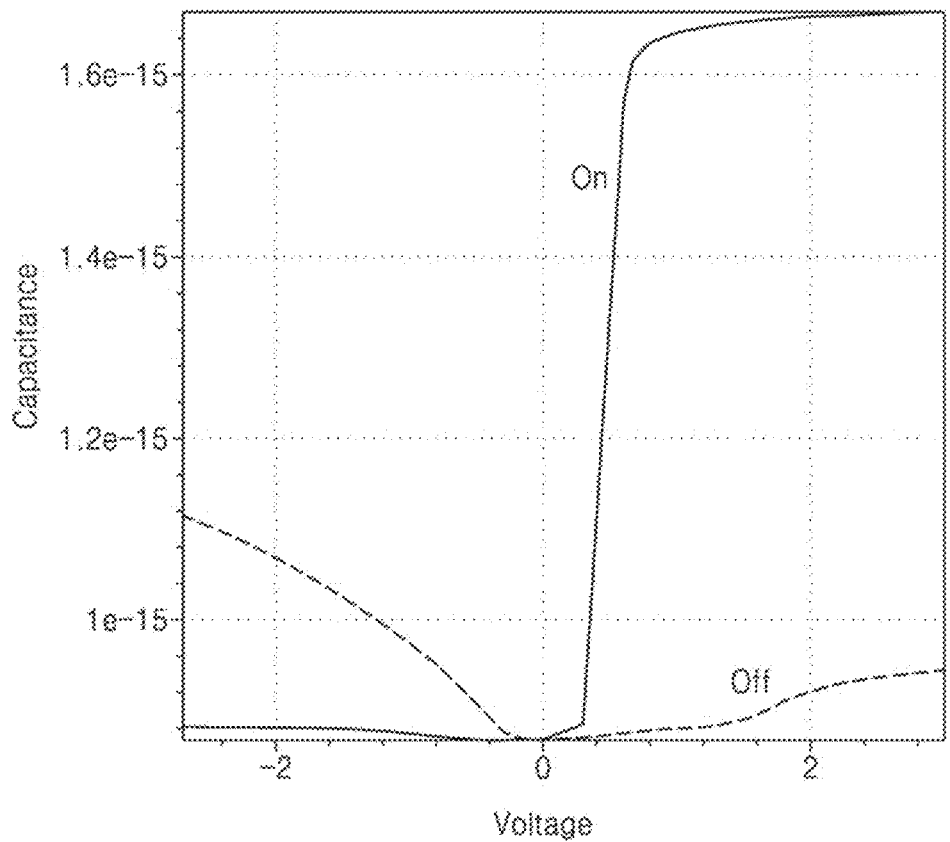
FIG. 2 is a graph showing simulation results with respect to a change in the capacitance of a quantum dot layer.

As described above, the electrons and holes generated in the quantum dot layer 60 are separated from each other by the quantum dots 61 disposed therebetween. Therefore, in the FET opto-electronic device 100 shown in FIG. 1, the quantum dot layer 60 may be modeled as a capacitor. The capacitance of the quantum dot layer 60 varies according to the intensity of light that enters the quantum dot layer 60. FIG. 2 is a graph showing a simulation result for a change in the capacitance of a quantum dot layer 60. A simulation is performed such that a stacked structure of oxide ($SiO_2$)/ SIZO/quantum dots/SIZO/oxide ($SiO_2$) is formed, a light source is turned ON/OFF in a state in which a voltage is applied to the oxides disposed at opposite sides, and capacitance/voltage (C/V) values are measured. Referring to FIG. 2, it is confirmed that the capacitance more sharply varies according to variations in the voltage in a state in which the light source is ON than in a state in which the light source is OFF. The variation in the capacitance of the quantum dot layer 60 induces a change in the threshold voltage in the FET opto-electronic device 100. Therefore, the incidence of light may be detectable by detecting the change in the current flowing from the source region 20 to the drain region 30.

By employing the quantum dot layer 60, more photocarriers are generated per unit hour than photons entering the opto-electronic device 100, and thus, the change in the threshold voltage depending on the change in the intensity of incident light is significantly high. Therefore, a clean image can be obtained even with a low intensity of incident light by using the opto-electronic device 100 according to the example embodiment. In addition, by employing the quantum dot layer 60, the output signal is amplified, and thus, a signal-to-noise ratio of the opto-electronic device 100 may be enhanced.

Since the quantum dot layer 60 having the quantum dots 61 dispersed in the transparent layer 62 improves the electron-hole separating efficiency, the opto-electronic device 100 may have high sensitivity. In such a manner, a significant change in the capacitance may be induced to the quantum dot layer 60 even with a small amount of light. Therefore, the signal-to-noise ratio of the opto-electronic device 100 may be enhanced and a driving voltage may be reduced. Since a wavelength band of detectable light is determined by the bandgap of the quantum dots 61, a general semiconductor material, such as silicon, may be used as a material of the semiconductor substrate 10. Therefore, the opto-electronic device 202 can be manufactured at low cost by adopting a general silicon process.

Electric current flowing between the first electrode 41 and the second electrode 42 may be controlled by adjusting a width of a depletion area in the semiconductor substrate 10 by adjusting the voltage applied to the transparent electrode layer 80. Therefore, dark noises, which are caused by electric current flowing between the first electrode 41 and the second electrode 42 even when the light does not enter the opto-electronic device 100, may be suppressed or reduced, and thereby enhancing the signal-to-noise ratio of the opto-electronic device 100.

Since the opto-electronic device 100 is easily turned ON/OFF by adjusting the voltage applied to the transparent electrode layer 80, a switching operation for outputting electric current from the opto-electronic device 100 may be performed by turning ON the opto-electronic device 100 only when outputting of a signal is required.

Figure 3:
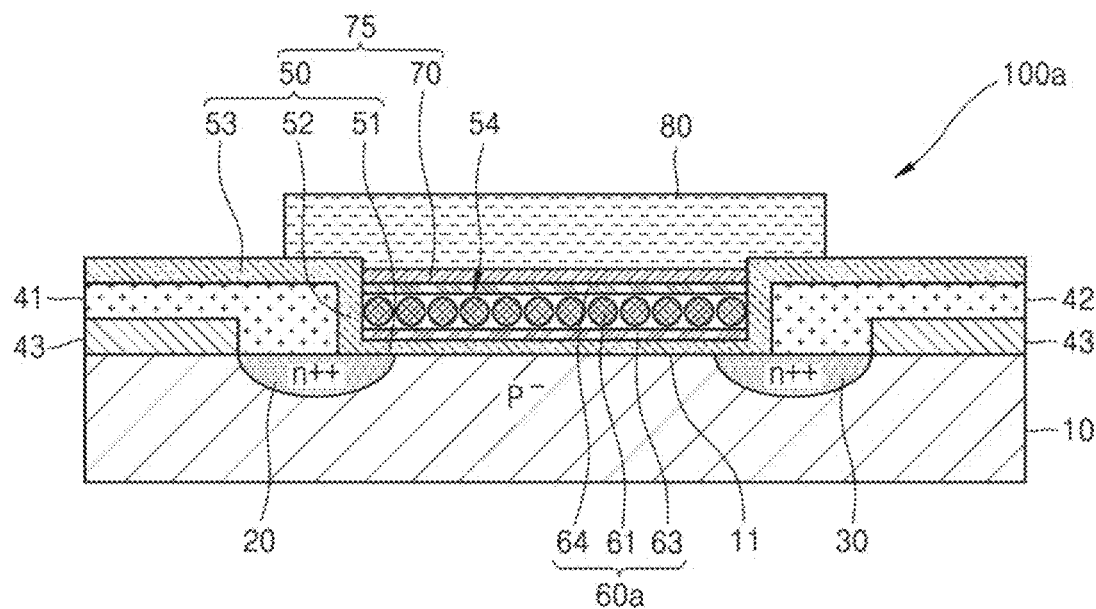
FIG. 3 is a cross-sectional view schematically showing a structure of an opto-electronic device according to an example embodiment.

FIG. 3 is a cross-sectional view schematically showing a structure of an opto-electronic device 100a according to an example embodiment. The opto-electronic device 100a according to the example embodiment differs from the opto-electronic device 100 shown in FIG. 1 with respect to a structure of a quantum dot layer 60*a*. Thus, the same components as those having been described with reference to FIG. 1 are denoted by the same reference numerals and repeated explanations thereof will be omitted.

Referring to FIG. 3, the quantum dot layer 60*a* is configured such that a first layer 63, quantum dots 61, and a second layer 64 are sequentially stacked. For example, the first layer 63 is stacked on a first portion 51 of the first insulation layer 50. The quantum dots 61 are stacked on the first layer 63. The quantum dots 61 may have a variety of configurations including, for example, a single-layered configuration, a multi-layered configuration, a regularly arranged configuration, an irregularly arranged configuration, or the like. The second layer 64 covers the quantum dots 61. The first layer 63 and the second layer 64 may be first oxide semiconductor layer and second oxide semiconductor layer made of an oxide semiconductor material. The second layer 64 may be made of a light transmissible material with respect to a wavelength band of the light to be detected by the opto-electronic device 100 to transfer the light having passed through the transparent electrode layer 80 to the quantum dots 61. The second layer 64 may be made of a transparent oxide semiconductor material. The transparent oxide semiconductor material may include, for example, silicon indium zinc oxide (SIZO), silicon zinc tin oxide (SZTO), indium gallium zinc oxide (IGZO), indium zinc oxide (IZO), or zinc tin oxide (ZTO). The first layer 63 and the second layer 64 may be the same material layer. The first layer 63 and the second layer 64 may have the same electrical characteristics. The manufacturing cost of the quantum dot layer 60*a* may be reduced by forming the first layer 63 and the second layer 64 using the same material.

With this configuration, the electrons and holes generated in the quantum dot layer 60*a* are separated from each other with the quantum dots 61 disposed therebetween. The capacitance of the quantum dot layer 60*a* varies according to the intensity of incident light, and the variation in the capacitance of the quantum dot layer 60*a* induces a change in the threshold voltage in the FET opto-electronic device 100. Therefore, the incident light may be detectable by detecting the change in the current flowing from the source region 20 to the drain region 30.

Figure 4:
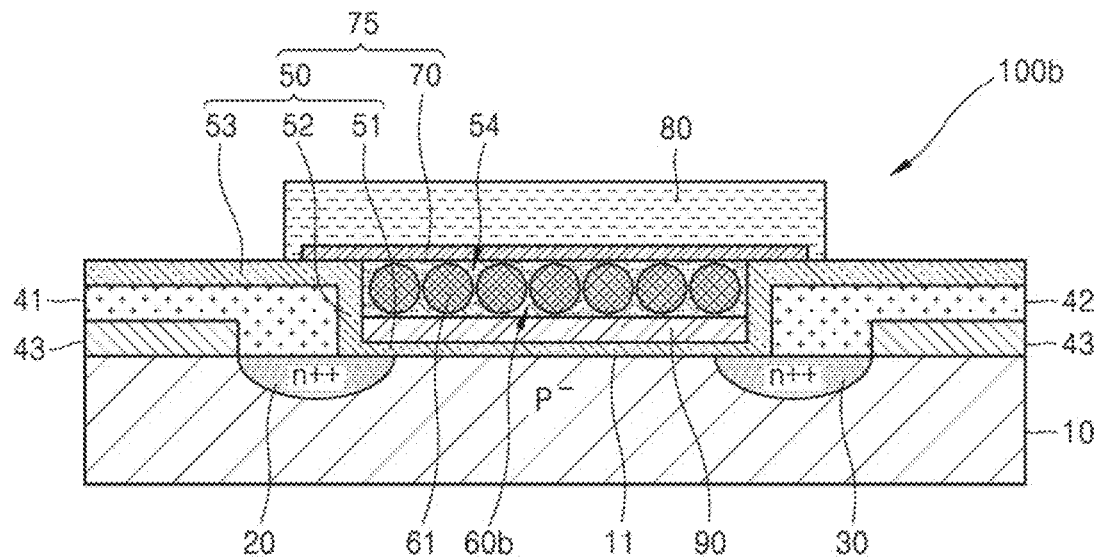
FIG. 4 is a cross-sectional view schematically showing a structure of an opto-electronic device according to an example embodiment.

FIG. 4 is a cross-sectional view schematically showing a structure of an opto-electronic device 100*b* according to an example embodiment. The opto-electronic device 100*b* according to the example embodiment differs from the opto-electronic device 100 shown in FIG. 1 and the opto-electronic device 100*a* shown in FIG. 3 in that a conductive layer 90 is interposed between a first insulation layer 50 and a quantum dot layer 60. Thus, the same components as those having been described with reference to FIGS. 1 to 3 are denoted by the same reference numerals and repeated explanations thereof will be omitted.

Referring to FIG. 4, a quantum dot layer 60*b* may be the same as the quantum dot layer 60 shown in FIG. 1 or the quantum dot layer 60*a* shown in FIG. 3. The conductive layer 90 is interposed between the first insulation layer 50 and the quantum dot layer 60*b*. The conductive layer 90 may be provided to contact the quantum dot layer 60*b*. The conductive layer 90 may be made of, for example, a conductive material such as tungsten, aluminum, or copper. A portion of the conductive layer 90 may be exposed to the exterior side of the first insulation layer 50 and the second insulation layer 70.

The conductive layer 90 may function as a floating gate. For example, after the quantum dot layer 60*b* is refreshed by applying a reset voltage to the conductive layer 90, a voltage applied to the conductive layer 90 may be cut off. In such a state, if light enters the quantum dot layer 60*b*, photocarriers are generated, and thus electrons or holes may accumulate on the conductive layer 90. A threshold voltage of the FET opto-electronic device 100*b* changes to change the current flowing from the source region 20 to the drain region 30. The intensity of light may be detected by detecting a change in the current.

Figure 5:
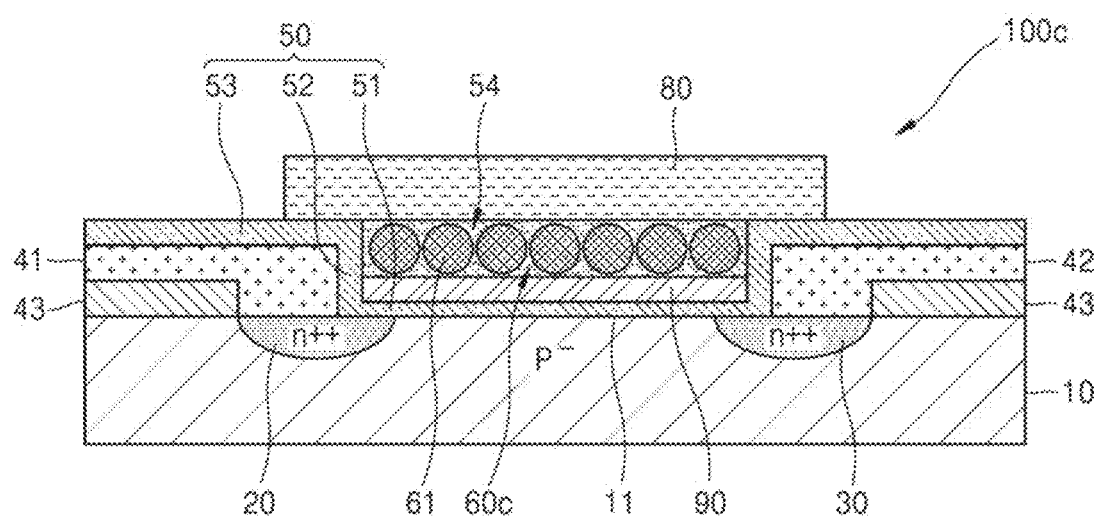
FIG. 5 is a cross-sectional view schematically showing a structure of an opto-electronic device according to an example embodiment.

FIG. 5 is a cross-sectional view schematically showing a structure of an opto-electronic device 100*c* according to an example embodiment. The opto-electronic device 100*c* according to the example embodiment differs from the opto-electronic device 100*b* shown in FIG. 4 in that the second insulation layer 70 is omitted. Thus, the same components as those having been described with reference to FIGS. 1 to 4 are denoted by the same reference numerals and repeated explanations thereof will be omitted.

Referring to FIG. 5, a quantum dot layer 60*c* may be the same as the quantum dot layer 60 shown in FIG. 1 or the quantum dot layer 60*a* shown in FIG. 3. The quantum dot layer 60*c* functions as an insulation layer between the transparent electrode layer 80 and the conductive layer 90 while functioning to detect light. The conductive layer 90 and the quantum dot layer 60*c* are insulated from a semiconductor substrate 10 by a first insulation layer 50. The conductive layer 90 may be provided to come into contact with the quantum dot layer 60*c*. Photocarriers are generated in the quantum dot layer 60*c* according to the intensity of light incident to the quantum dot layer 60*c*. Among the electrons and holes, photocarriers having the same polarity as a voltage applied to the transparent electrode layer 80 as a control electrode are transferred to the conductive layer 90 to then accumulate on the conductive layer 90. A threshold voltage of the FET opto-electronic device 100*c* changes to thus change the current flowing from the source region 20 to the drain region 30. The intensity of light may be detected by detecting a change in the current.

Figure 6:
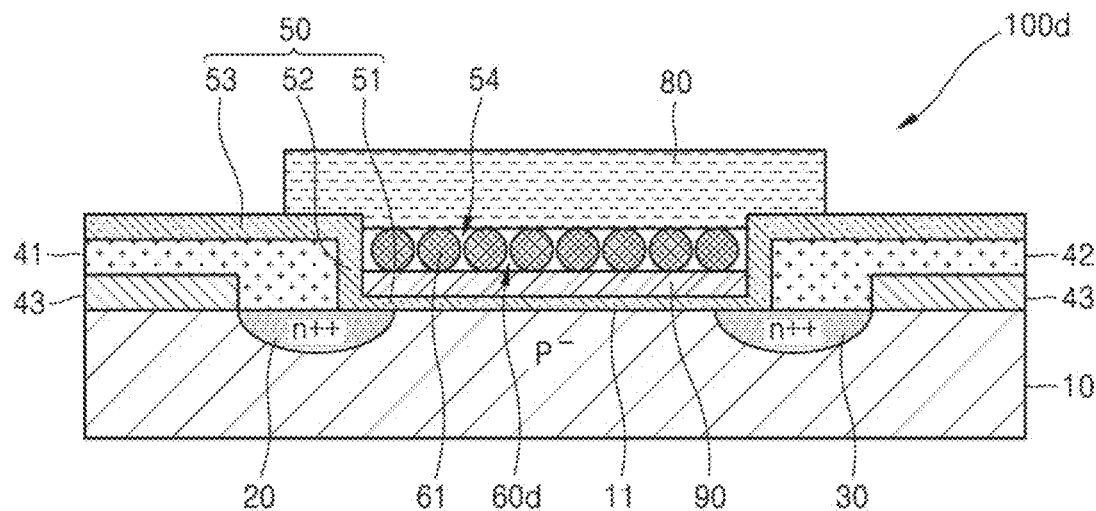
FIG. 6 is a cross-sectional view schematically showing a structure of an opto-electronic device according to an example embodiment.

FIG. 6 is a cross-sectional view schematically showing a structure of an opto-electronic device 100*d* according to an example embodiment. The opto-electronic device 100*d* according to the example embodiment differs from the opto-electronic device 100*c* shown in FIG. 5 in that a quantum dot layer 60*d* is employed, while a transparent layer 62, a first layer 63 and a second layer 64 are omitted. Thus, the same components as those having been described with reference to FIGS. 1 to 5 are denoted by the same reference numerals and repeated explanations thereof will be omitted.

Referring to FIG. 6, a conductive layer 90 and quantum dots 61 are sequentially stacked on a first insulation layer 50. A transparent electrode layer 80 is stacked on the quantum dots 61. The conductive layer 90 functions as a floating gate. The quantum dots 61 functions as an insulation layer between the transparent electrode layer 80 and the conductive layer 90 while functioning to detect light. The conductive layer 90 and the quantum dot layer 60*d* are insulated from the semiconductor substrate 10 by the first insulation layer 50. The conductive layer 90 may be provided to contact the quantum dot layer 60*d*. Photocarriers are generated at the quantum dots 61 according to the light entering the quantum dots 61. Among the electrons and holes, photocarriers having the same polarity as a voltage applied to the transparent electrode layer 80 as a control electrode are transferred to the conductive layer 90 to then accumulate on the conductive layer 90. A threshold voltage of the FET opto-electronic device 100*c* changes to change the current flowing from the source region 20 to the drain region 30. The intensity of light may be detected by detecting a change in the current.

Figure 7:
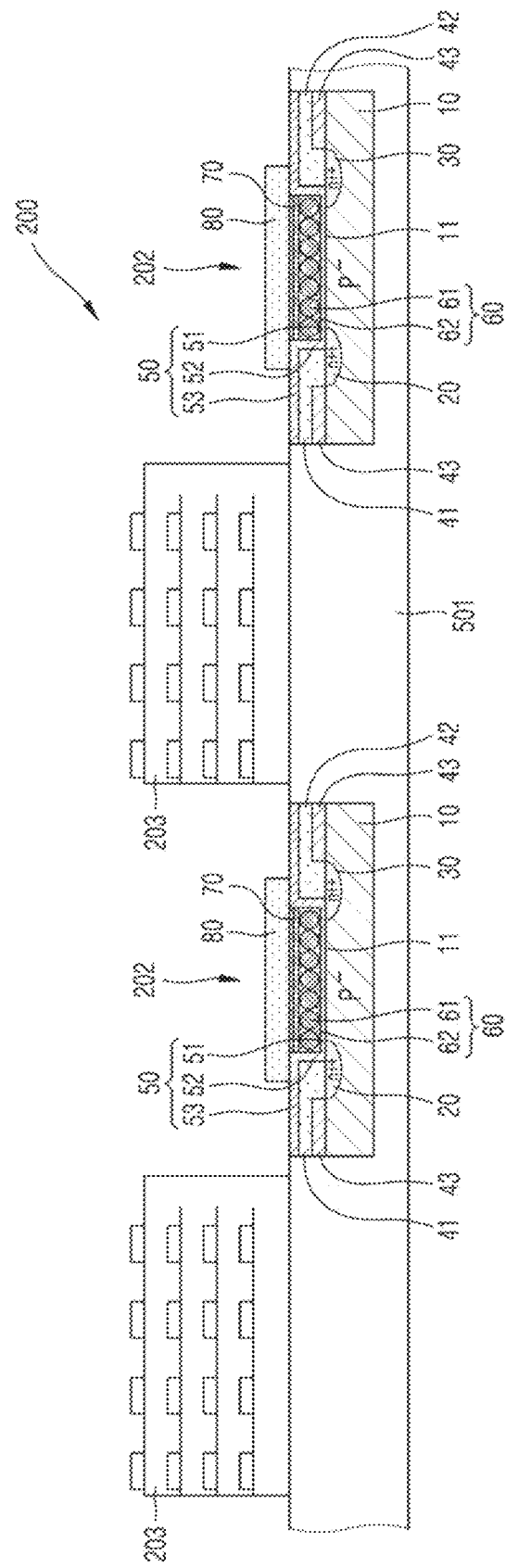
FIG. 7 is a cross-sectional view schematically showing a structure of an image sensor according to an example embodiment, including a plurality of opto-electronic devices.

The opto-electronic devices of the above-described example embodiments may be used alone as light receiving elements or may be arranged in a two-dimensional array to constitute image sensors. FIG. 7 is a cross-sectional view schematically showing a structure of an image sensor according to an example embodiment, including a plurality of opto-electronic devices. Referring to FIG. 7, the image sensor 200 may include an array of a plurality of opto-electronic devices 202 formed on a semiconductor substrate 501 and a plurality of driving circuits 203 for outputting signals from the respective opto-electronic devices 202. The example opto-electronic devices shown in FIGS. 1 and 3 to 6 may be employed as the opto-electronic devices 202.

Although two opto-electronic devices 202 and two driving circuits 203 are illustrated in FIG. 7 as an example, many more opto-electronic devices 202 and driving circuits 203 may be actually arranged in a two-dimensional array.

With the expansion of market volumes of smartphones, autonomous driving vehicles, robots, or security systems, there is a demand for an opto-electronic device which is stably operable in a low-light environment and is capable of achieving miniaturization and reduction in costs, and an image sensor employing the opto-electronic device. A night vision image sensor using InGaAs requires a cooling module due to high heat generation, and inevitably becomes bulky and expensive. However, the opto-electronic devices 202 of the example embodiment has high sensitivity, and thus is operable with a low driving voltage of, for example, 10 V or less. Therefore, since the image sensor 200 employing the opto-electronic devices 202 generates a small amount of heat, a cooling module is not required. In addition, since the wavelength band of detectable light is determined by the bandgap of quantum dots, a general semiconductor material, such as silicon, may be used as a material of the semiconductor substrate 10. Therefore, the opto-electronic devices 202 can be manufactured at low cost by adopting a general silicon process, thereby implementing the low-cost opto-electronic devices 202 and the image sensor 200 employing the same. In addition, since the pixel size of the image sensor 200 can be further reduced, the image sensor 200 may have a further increased level of resolution.

In addition, by determining diameters of the quantum dots 61 according to the wavelength band of light to be detected, the light in a wavelength band ranging from, for example, 800 nm to 2400 nm, may be detectable. Since the opto-electronic devices 202 has a low dark noise proportion and high sensitivity, the image sensor 200 employing the opto-electronic devices 202 is capable of obtaining a clear image even with a low intensity of incident light. Therefore, a night vision image sensor having a compact size, low manufacturing costs, and stable operation, may be implemented.

While the opto-electronic device and the image sensor including the same have been described with reference to one or more example embodiments illustrated in the figures, the example embodiments described herein have been presented by way of example only, and it will be appreciated by those skilled in the art that various changes and other equivalent embodiments may be made from the above description. Therefore, the example embodiments should be considered not in a limited sense but in a descriptive sense. The scope of the present disclosure is not limited to the example embodiment described and illustrated above but is defined by the appended claims. It will be construed that the present disclosure includes all differences which ranges in the equivalent scope of the claims.

According to the example embodiments, a clear image may be obtained even with a low intensity of incident light and an enhanced signal-to-noise ratio may be attained by employing a quantum dot layer. In addition, an opto-electronic device having high sensitivity and an image sensor employing the same may be achieved by improving electron-hole separating efficiency. In addition, an opto-electronic device, which is operable with a low driving voltage, and an image sensor employing the same, may be implemented without requiring additional devices, such as a cooling module, thereby achieving miniaturization and reduction in costs.

It should be understood that example embodiments described herein should be considered in a descriptive sense only and not for purposes of limitation. Descriptions of features or aspects within each embodiment should typically be considered as available for other similar features or aspects in other example embodiments. While example embodiments have been described with reference to the figures, it will be understood by those of ordinary skill in the art that various changes in form and details may be made therein without departing from the spirit and scope as defined by the following claims.

What is claimed is:

1. An opto-electronic device comprising:
a semiconductor substrate doped with a first conductivity type impurity;
a source region and a drain region provided on the semiconductor substrate spaced apart from each other and doped with a second conductivity type impurity which is electrically opposite to the first conductivity type impurity;
a first electrode and a second electrode electrically connected to the source region and the drain region, respectively;
a quantum dot layer provided between the source region and the drain region on the semiconductor substrate and comprising quantum dots;
a first insulation layer configured to insulate the semiconductor substrate and the quantum dot layer from each other, the first insulation layer being provided on a bottom surface and a side surface of the quantum dot layer; and
a transparent electrode layer provided on the quantum dot layer.

2. The opto-electronic device of claim 1, further comprising a second insulation layer configured to insulate the transparent electrode layer and the quantum dot layer from each other.

3. The opto-electronic device of claim 2, wherein the first insulation layer and the second insulation layer form an insulating material layer surrounding the quantum dot layer.

4. The opto-electronic device of claim 3, wherein the quantum dot layer comprises a transparent layer, and
wherein the quantum dots are dispersed in the transparent layer.

5. The opto-electronic device of claim 4, wherein the transparent layer comprises a transparent oxide semiconductor material.

6. The opto-electronic device of claim 5, wherein the transparent oxide semiconductor material comprises at least one of silicon indium zinc oxide (SIZO), silicon zinc tin oxide (SZTO), indium gallium zinc oxide (IGZO), indium zinc oxide (IZO), and zinc tin oxide (ZTO).

7. The opto-electronic device of claim 5, further comprising a conductive layer provided between the quantum dot layer and the first insulation layer.

8. The opto-electronic device of claim 3, wherein the quantum dot layer further comprises a first layer provided on the first insulation layer, the quantum dots provided on the first layer, and a second layer covering the quantum dots.

9. The opto-electronic device of claim 8, wherein the first layer and the second layer each comprise an oxide semiconductor material.

10. The opto-electronic device of claim 9, wherein the second layer is transparent.

11. The opto-electronic device of claim 10, wherein the oxide semiconductor material comprises at least one of silicon indium zinc oxide (SIZO), silicon zinc tin oxide (SZTO), indium gallium zinc oxide (IGZO), indium zinc oxide (IZO), and zinc tin oxide (ZTO).

12. The opto-electronic device of claim 9, further comprising a conductive layer provided between the quantum dot layer and the first insulation layer.

13. The opto-electronic device of claim 1, further comprising a conductive layer provided between the quantum dot layer and the first insulation layer.

14. The opto-electronic device of claim 13, wherein the quantum dot layer comprises a transparent oxide semiconductor layer and the quantum dots dispersed in the transparent oxide semiconductor layer.

15. The opto-electronic device of claim 13, wherein the quantum dot layer further comprises a first layer disposed on the first insulation layer, the quantum dots being disposed on the first layer, and a second layer covering the quantum dots,
wherein the first layer and the second layer comprise an oxide semiconductor material, and
wherein the second layer is transparent.

16. An opto-electronic device comprising:
a semiconductor substrate doped with a first conductivity type impurity;
a source region and a drain region provided on the semiconductor substrate spaced apart from each other and doped with a second conductivity type impurity which is electrically opposite to the first conductivity type impurity;
a first electrode and a second electrode electrically connected to the source region and the drain region, respectively;
a transparent electrode layer provided between the source region and the drain region on the semiconductor substrate; and
a quantum dot layer comprising quantum dots, the quantum dot layer being provided between the transparent electrode layer and the semiconductor substrate on the semiconductor substrate, and all surfaces of the quantum dot layer being surrounded by an insulating material layer.

17. The opto-electronic device of claim 16, wherein the quantum dot layer comprises a transparent oxide semiconductor layer, and
wherein the quantum dots are surrounded by the transparent oxide semiconductor layer.

18. The opto-electronic device of claim 16, wherein the quantum dot layer further comprises a first oxide semiconductor layer, the quantum dots being disposed on the first oxide semiconductor layer, and a second oxide semiconductor layer covering the quantum dots.

19. The opto-electronic device of claim 16, further comprising a conductive layer in contact with the quantum dot layer and provided between the quantum dot layer and the insulating material layer.

20. An image sensor comprising:
an array of a plurality of opto-electronic devices; and
a driving circuit configured to output a signal from each of the opto-electronic devices,
wherein each of the opto-electronic devices comprises:
a semiconductor substrate doped with a first conductivity type impurity;
a source region and a drain region provided on the semiconductor substrate spaced apart from each other and doped with a second conductivity type impurity which is electrically opposite to the first conductivity type impurity;
a first electrode and a second electrode electrically connected to the source region and the drain region, respectively;
a transparent electrode layer provided between the source region and the drain region on the semiconductor substrate; and
a quantum dot layer comprising quantum dots, the quantum dot layer being provided between the transparent electrode layer and the semiconductor substrate on the semiconductor substrate, and all surfaces of the quantum dot layer being surrounded by an insulating material layer.

* * * * *